Figure 1:
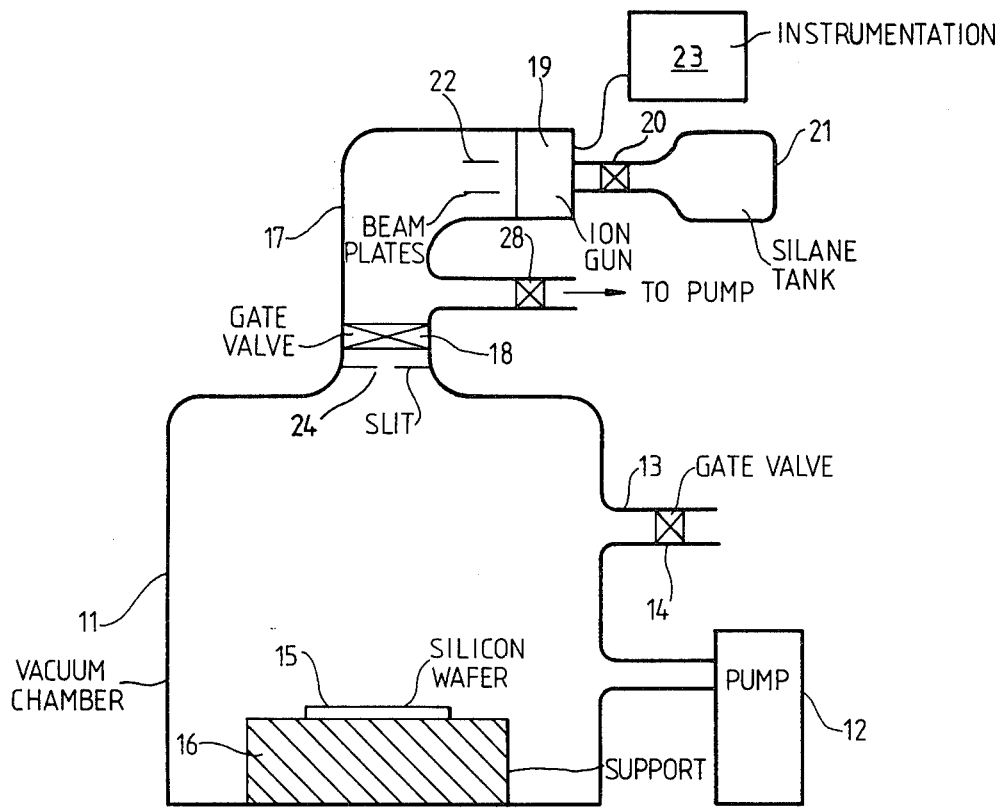

United States Patent [19]

Heinecke

[11] Patent Number: 4,482,394

[45] Date of Patent: Nov. 13, 1984

[54] METHOD OF MAKING ALUMINUM ALLOY FILM BY IMPLANTING SILICON IONS FOLLOWED BY THERMAL DIFFUSION

[75] Inventor: Rudolf A. H. Heinecke, Harlow, England

[73] Assignee: ITT Industries, Inc., New York, N.Y.

[21] Appl. No.: 415,969

[22] Filed: Sep. 8, 1982

[30] Foreign Application Priority Data

Oct. 6, 1981 [GB] United Kingdom ................. 8130106

[51] Int. Cl.³ ...................... H01L 7/00; H01L 21/265
[52] U.S. Cl. .................................. 148/1.5; 29/576 B; 357/65; 357/91
[58] Field of Search ...................... 148/1.5; 29/576 B; 357/65, 91

[56] References Cited

U.S. PATENT DOCUMENTS 3,600,797 8/1971 Bower et al. .......................... 29/584
3,740,835 6/1973 Duncan .................................. 29/578
3,871,067 3/1975 Bogardus et al. ..................... 29/571
4,135,292 1/1979 Jaffe et al. ............................. 29/578
4,313,768 2/1982 Sanders et al. ....................... 148/1.5

Primary Examiner—Upendra Roy
Attorney, Agent, or Firm—James B. Raden; Marvin M. Chaban

[57] ABSTRACT

Aluminum metallization layers on a semiconductor substrate are alloyed with a predetermined quantity of silicon by implanting silicon ions into the metallization layer. The layer is heated during subsequent processing to a temperature of 300° to 500° C. at which simultaneous annealing and diffusion take place to form the alloy.

An apparatus for performing the process comprises a vacuum chamber wherein implantation is effected, an ion gun and means including a deflection magnet slit for selecting a single ionic species for implantation.

2 Claims, 3 Drawing Figures

METHOD OF MAKING ALUMINUM ALLOY FILM BY IMPLANTING SILICON IONS FOLLOWED BY THERMAL DIFFUSION

This invention relates to semiconductor integrated circuits, and in particular to techniques for the provision of alloyed metal contact layers on said circuits and to apparatus for carrying out such techniques.

Integrated circuits are provided with interconnecting conductor patterns which provide contact to the various portions of the circuit. Typically these conductor patterns are formed from a layer of deposited metal, generally aluminum, which is subsequently etched selectively to produce the desired pattern. Aluminum is established as the only acceptable single layer metallization material for silicon integrated circuits. A serious disadvantage of pure aluminum films in such applications is the solidphase-dissolution and associated etch pits in the device contact windows at the elevated temperatures required for ohmic contact formation, MOS interface annealing, deposition of subsequent layers and packaging. It has been found that when aluminum is deposited on a silicon surface there is subsequent diffusion during contact sintering treatments of the silicon into the aluminum to form an alloy. It will be appreciated that if the semiconductor material has been doped in shallow layers to provide device regions, the loss of silicon from the semiconductor surface will alter or even destroy the p-n junctions by depletion of silicon with consequent deleterious effects on the device characteristics.

To remedy the situation, the industry has adopted the method of co-depositing SiAl alloys in order to keep the aluminum saturated with silicon when heated. This method has, however, resulted in a number of new problems. Owing to the considerable reduction of the solubility of silicon in aluminum with decreasing temperature, silicon is precipitated thereby:
- increasing stress and undesirable hillock formation which affects the integrity of subsequent protection layers
- producing electrical leakage paths due to non-uniform etching
- causing oxide damage during probing
- changing the electrical contact properties due to precipitation of p-silicon in the contact windows.

These problems are often aggravated by conventional deposition processes in which, because of difficulties in film composition control, films with silicon concentration far in excess of the solid solubility limit are deposited in order to ensure saturation.

The object of the present invention is to minimize or to overcome these disadvantages.

According to one aspect of the present invention there is provided a method of alloying a metal surface film on a body, including implanting said film with ions of one or more alloying materials.

According to another aspect of the present invention there is provided an apparatus for alloying a metal film on a semiconductor substrate, including a vacuum tight chamber, means for mounting said substrate within the chamber, means for heating said substrate, and means for irradiating the metal film on said substrate with a measured flux of a single ionic species so as to implant that species into the metal film.

We have found that diffusive depletion of silicon from a semiconductor surface can be substantially avoided without the risk of degradation of a metallization layer by the implantation therein of a calculated and precisely defined quantity of silicon. The implanation process is simple to control as the quantity of silicon implanted is determined by the ion beam current. Furthermore, as the path length of silicon ions in aluminium is very short, there is a very wide tolerance on the implantation voltage.

Figure 2:
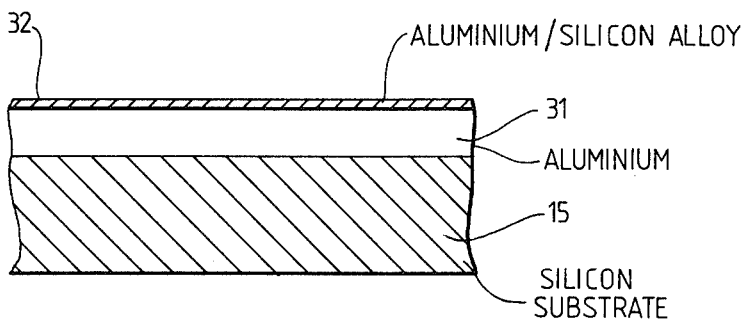
Figure 3:
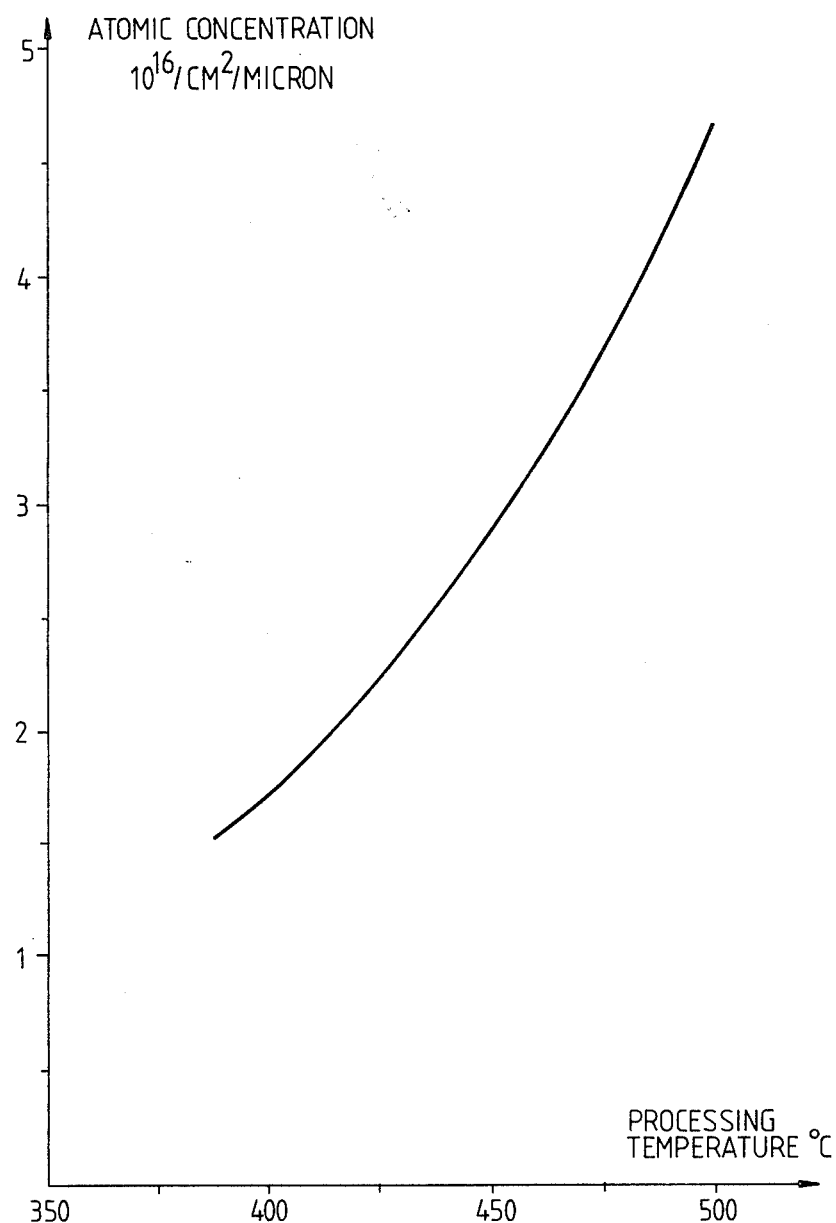

An embodiment of the invention will now be described with reference to the accompanying drawing in which, FIG. 1 is a schematic view of an apparatus for implantation alloying of metallization layers on integrated circuits;

FIG. 2 is a cross section of a circuit provided with a metallization layer implanted by the apparatus of FIG. 1, and FIG. 3 illustrates the relationship between processing temperature and optimum implantation dose.

Referring to FIG. 1, the implantation apparatus includes a vacuum chamber 11 in which implantation is affected and which can be evacuated via pump 12 which typically comprises a diffusion pump. Back filling and/or flushing of the chamber 11 with an inert gas may be effected via inlet port 13 and valve 14. Metallized wafers 15 to be implanted are disposed on an earthed support 16 to which ions are directed via a beam tube 17. Advantageously the beam tube 17 can be isolated from the chamber 11 by the gate valve 18, e.g. during backfilling to remove or insert wafers 15 from or into the chamber 11. The beam tube 17 may also be provided with vacuum pumping means via gate valve 28 to ensure that the beam tube maintains a hard vacuum.

Silicon ions are generated by an ion gun assembly 19 by ionization of silane fed at a controlled rate through a metering valve 20 from a storage tank 21. The ions thus produced are accelerated by one or more electrodes 22 maintained at a high potential typically in the range 10 to 100 kilovolts. The ion current may be monitored by current measuring means 23 coupled to the ion gun 19.

The ions produced by the gun 19 are accelerated by the electrodes 22 and pass through a transverse magnetic field (not shown) whereby each ion is deflected by an angle corresponding to its charge/mass ratio. The deflected ion beam is then directed through a slit 24 positioned such that only those ions of the devised charge/mass ratio are allowed to remain in the ion beam entering the chamber 11. In some applications silicon ions of mass number 28 may be employed, but we prefer to employ $SiH_2$ ions of mass number 30. It has been found that unless considerable precautions are taken, any vacuum system will contain residual traces of nitrogen which produces $N_2$ ions also of mass number 28. Thus, by employing $SiH_2$ ions of mass number 30, nitrogen contamination of the ion beam directed into the chamber is avoided.

Within the chamber 11 the ion beam impinges on a metallized process wafer 15 whereby silicon is implanted into the metallization layer 31 (FIG. 2) to form a silicon rich layer 32 adjacent the metal surface. Since the metallization layer 31, typically aluminum, is substantially opaque to silicon ions the implantation process is substantially independent of the accelerating voltage. For example, accelerating voltages in the range 10 to 100 kilovolts may be employed, although this range is in no way to be contributed limiting. Typically the penetration depth of silicon ions in aluminum is of the order of 0.1 microns.

To achieve uniformity of implantation the ion beam is scanned back and forth in a raster pattern across the process wafer 15. This scanning may be affected with the aid of scan coils (not shown) or orthogonal pairs of scan electrodes (not shown) to which appropriate 'line' and 'frame' voltage signals are applied. These techniques are well known to those skilled in the particle beam handling art and need not be further detailed.

The quantity of ions implanted in the metallization layer 31 (FIG. 2) can be determined by measuring the total charge delivered via the ion beam. This may be effected by coupling the metallization layer to ground via a resistor and monitoring the voltage thereby induced across the resistor. It will of course be appreciated that once the system has been set up from a particular set of implantation conditions repeatability is then very simple to achieve by correct setting of the accelerating voltage, the beam current and the duration of the implantation.

To effect alloying, e.g. of silicon in aluminum, a metallized process wafer 15 is placed on the support 16 in the chamber 11 which is then evacuated. The ion beam is then turned on for a predetermined period so as to implant a measured dose of silicon into the metallization layer. This dose is typically within the range $10^{16}$ and $10^{17}$ silicon atoms/cm$^2$/micron thickness and is preferably 1.5 to $5 \times 10^{16}$ atoms/cm$^2$/ micron, dependent on the highest subsequent processing temperature.

The chamber 11 is back filled, e.g. with nitrogen, and the treated wafer is removed for subsequent processing.

Typically the alloyed metallization layer is selectively etched, e.g. by plasma etching in carbon tetrachloride vapor, to define a conductor pattern, after which the wafer is contact sintered, probe tested, and diced into individual circuits which are then contacted and packaged.

At the elevated temperatures to which the wafer 15 is subjected during this subsequent processing, e.g. during the contact sintering and the encapsulation stages, the alloy anneals, thus repairing the radiation damage and providing, by migration of the implanted silicon a substantially homogeneous composition.

The optimum quantity of silicon to be implanted in the aluminum layer is determined by the temperature at which subsequent processing is affected. The solubility of silicon in aluminum is strongly temperature dependent and the allowance of this should be made when valuating the implantation dose. The relationship between processing temperature and optimum implanted dose is illustrated in FIG. 3 of the accompanying drawings. Typical values we also set out in the Table below.

TABLE

| Implanted dose Silicon atoms/cm$^2$/micron | Processing Temperature °C. |
| --- | --- |
| $1.70 \times 10^{16}$ | 400 |
| $2.76 \times 10^{16}$ | 450 |
| $4.60 \times 10^{16}$ | 500 |

It will be appreciated that the techniques described herein are not limited to the alloying of aluminum film with silicon but can also be employed with a number of applications, wherein the metal film is alloyed with an element, e.g. Cu or Mg, in order to improve its electromigration resistance, for instance.

We claim:

1. A method of alloying a metal surface film on a body including implanting said film with ions of one or more alloying materials, by generating ions at a controlled rate in an ion beam, deflecting each ion in the beam by an angle corresponding to charge/mass ratio of the ions, and transmitting only ions of a predetermined charge/mass ratio to the metal surface, and in which the body is subsequently processed at one of a plurality of known temperatures.

2. A method as claimed in claim 1, in which the rate of generation of ions is determined as a function of temperature of processing of the body.

* * * * *